United States Patent [19]
Monticelli

[11] Patent Number: 4,701,720
[45] Date of Patent: Oct. 20, 1987

[54] CAPACITIVE FEEDBACK TO BOOST AMPLIFIER SLEW RATE

[75] Inventor: Dennis M. Monticelli, Fremont, Calif.

[73] Assignee: National Semiconductor Corporation, Santa Clara, Calif.

[21] Appl. No.: 856,315

[22] Filed: Apr. 28, 1986

[51] Int. Cl.⁴ ............................................. H03F 3/45
[52] U.S. Cl. ................................. 330/260; 330/257; 330/291
[58] Field of Search ............... 330/156, 257, 260, 265, 330/271, 291, 112

[56] References Cited

U.S. PATENT DOCUMENTS 4,484,147 11/1984 Metz ............................... 330/291 X

FOREIGN PATENT DOCUMENTS 153815 11/1981 Japan .................................. 330/265

*Primary Examiner*—James B. Mullins
*Attorney, Agent, or Firm*—Gail W. Woodward

[57] ABSTRACT

An integrated circuit voltage follower buffer amplifier is provided with a feedback capacitor that is coupled to produce positive feedback current that acts to enhance slew rate. In an op amp a polarity sensitive slew rate enhancement acts to correct slew rate asymmetry. Circuits are shown for avoiding assymetry or boosting slew rate of both polarities. In all cases, the positive feedback current is made proportional to the rate of change of the output voltage.

6 Claims, 7 Drawing Figures

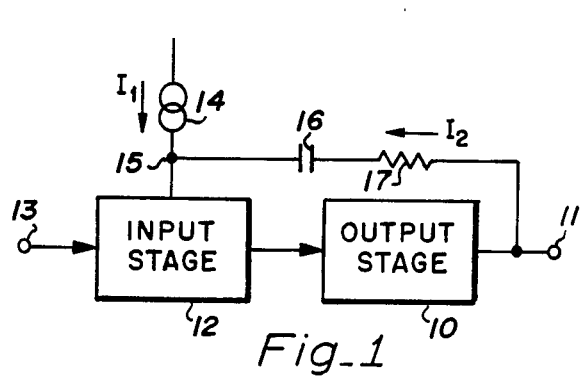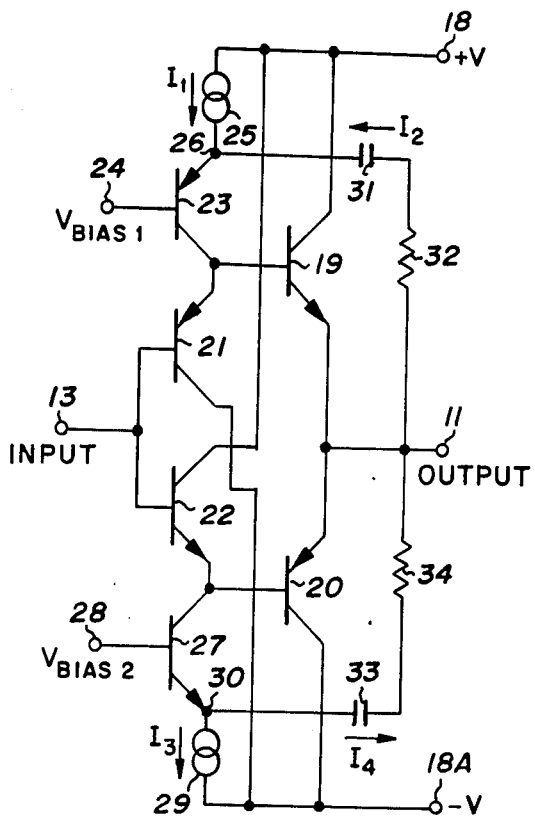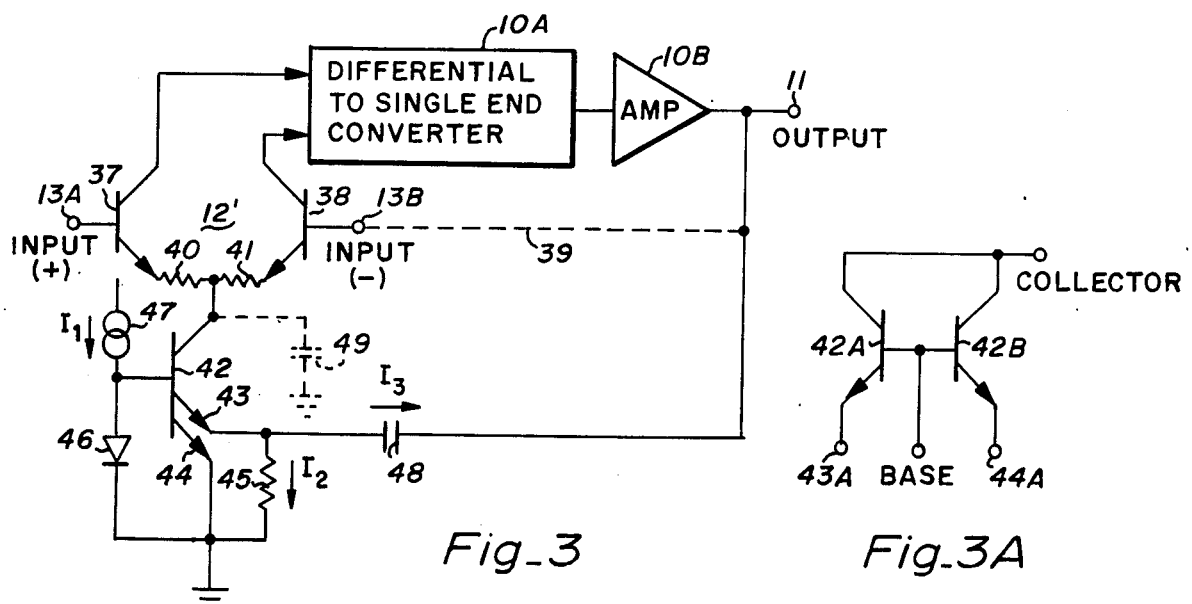

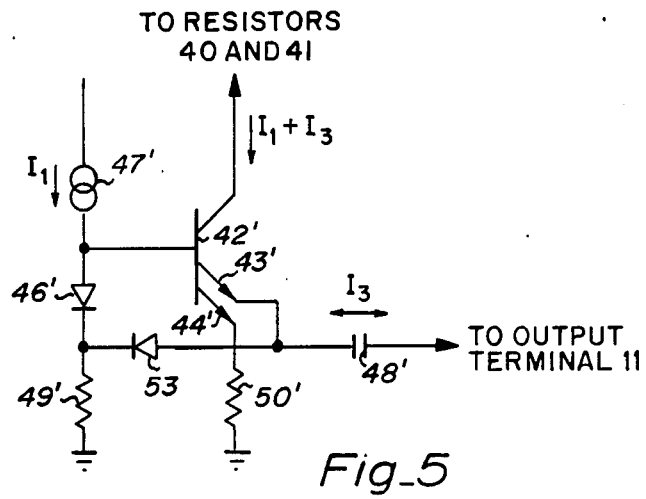
Fig_5
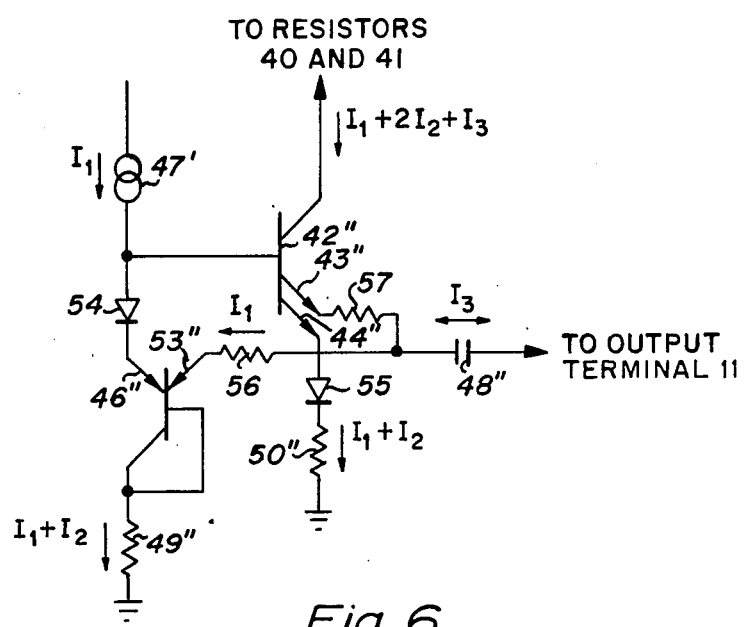
Fig_6

CAPACITIVE FEEDBACK TO BOOST AMPLIFIER SLEW RATE

BACKGROUND OF THE INVENTION

Amplifier slew rate is regarded as an implant parameter by the user of operational amplifiers (op amps) and buffers. Slew rate is the parameter dV/dt that indicates how rapidly the output voltage can change in response to a step function input. In the typical amplifier slew rate is expressed in volts per microsecond. A typical value is 10 volts/microsecond for the well-known LM102 family. The LF400, which has been designed for a high slew rate, has a rating of 57 volts/microsecond. The LH0063 known as the "Dam Fast Buffer Amplifier", represents an extreme slew rate limit in commercially available buffers of 6000 volts/microsecond.

Clearly slew rate is an important characteristic of a buffer amplifier. It would be desirable in the design of op amps and buffers to increase the circuit slew rate capability without degrading other performance parameters.

SUMMARY OF THE INVENTION

It is an object of the invention to employ capacitive positive feedback in an amplifier circuit to increase output slew rate.

It is a further object of the invention to employ capacitive positive feedback from the output or output related portion of an amplifier to a preceeding circuit portion current summing node where the output slew rate is increased.

These and other objects are achieved as follows. In an amplifier a capacitor is coupled between the output terminal and a current summing node in the input stage. The resultant current feedback is positive, that is, it is introduced of a polarity that boosts the slew limiting current in that preceeding stage. The feedback magnitude is kept low enough that the circuit remains stable, but sufficient feedback is employed to enhance the slew rate at the output terminal.

BRIEF DESCRIPTION OF THE DRAWING

FIG. 1 is a block diagram showing the details of the invention.

FIG. 2 is a schematic diagram of a buffer amplifier circuit employing the invention.

FIG. 3 is a schematic-block diagram of an operational amplifier employing the invention.

FIG. 3A is a schematic diagram showing the dual emitter transistor 42 of FIG. 3 in the form of two individual transistors FIG. 4 is a schematic diagram of a preferred current mirror circuit to be used in the FIG. 3 circuit.

FIG. 5 is a schematic diagram of an alternative current mirror circuit of the kind to be used in the FIG. 3 circuit.

FIG. 6 is a schematic diagram of another alternative current mirror of the kind used in the FIG. 3 circuit.

DESCRIPTION OF THE INVENTION

With reference to FIG. 1, a typical buffer or amplifier is shown in block diagram form. An output stage 10 provides driver output at terminal 11. An input stage 12 is driven from input terminal 13. In a typical buffer the voltage gain between terminals 13 and 11 is ordinarily close to unity, but considerable power gain is available. This means that a relatively low load impedance can be connected to and driven from terminal 11. In a typical buffer the signal at terminal 11 is a replica of the signal at terminal 13. However, a step function at terminal 13 will result in a related ramp voltage at terminal 11. This ramp is expressed in terms of the slew rate of the buffer.

Input stage 12 is supplied with current $I_1$ by means of source 14. This is the quiescent current of input stage 12. A feedback capacitor 16 is coupled between output terminal 11 and current summing node 15. Resistor 17 reduces the degradation in small signal stability and also serves to limit maximum current boost. The circuit configuration is selected so that $I_1$ and $I_2$ are additive at node 15 thus making the feedback positive. If the voltage at terminal 11 rises, the feedback will supply an increased current to the input stage 12 thereby enhancing the rise and increasing the buffer slew rate. This feedback current will be proportional to the time rate of change of the output voltage at terminal 11 according to the equation, $$I_2 = C_{16} dV_{11}/dt$$

where:

$C_{16}$ is the value of capacitor 16 and $dV_{11}/dt$ is the voltage change per unit time at terminal 11.

If the output voltage decreases, $I_2$ will flow the other way and thereby decrease the current supplied at node 15. This will act to enhance the decrease.

Capacitor 16 and resistor 17 are selected so that the positive feedback to node 15 is not sufficient to render the buffer unstable. Excessive feedback can cause the circuit to oscillate.

In the buffer amplifier of FIG. 2 the output stage is composed of complementary transistors 19 and 20. Their emitters, coupled in common to output terminal 11, comprise an emitter follower class B push-pull output stage. Their collectors are respectively returned to terminals 18 and 18A between which the circuit power supply $+V$ and $-V$ is connected.

Complementary transistors 21 and 22 are coupled as emitter followers to respectively drive the bases of transistors 19 and 20. Their inputs are commonly driven from input terminal 13.

Transistor 23 has its base operated at the $V_{BIAS1}$ voltage at terminal 24 and is coupled to act as a high impedance current source load for the emitter of transistor 21. Transistor 23 thereby conducts $I_1$ supplied by source 25. The emitter of transistor 23 comprises summing node 26.

Likewise, transistor 27 has its base operated at the $V_{BIAS2}$ potential at terminal 28 and is coupled to act as a high impedance current supply for the emitter of transistor 22. Transistor 27 thereby conducts $I_3$ passed by source 29. The emitter of transistor 27 comprises summing node 30.

If terminal 13 is operated to ground potential, which is not shown but is assumed to be half-way between the $+V$ and $-V$ potentials, it can be seen that output terminal 11 will be at substantially the same potential. This will define the circuit quiescent state. In operation, output terminal 11 will follow input terminal 13 in potential at close to unity gain. Transistors 21 and 19 act as cascaded emitter followers and have opposing level shifts that cancel. They will respond to positive input potentials above the quiescent or ground level. Transistors 22 and 20 act in the same manner to transmit negative input potentials below quiescent or ground level.

Capacitor 31 is coupled in series with resistor 32 to provide a feedback path from output terminal 11 to summing node 26. When the potential at terminal 11 rises above its quiesent value, $I_2$ will flow into node 26 thereby increasing the current in transistors 21 and 23. This feedback will assist and enhance the rise at terminal 11 because more current will be available to charge the capacitance on the base of transistor 19 and supply that device with any needed additional base current.

Likewise, capacitor 33 is coupled in series with resistor 34 to provide a feedback path from output terminal 11 to node 30. When the potential at terminal 11 falls below its quiescent value, $I_4$ will flow out of node 30 thereby increasing the current in transistors 22 and 27. This feedback will assist and enhance the fall at terminal 11.

It is to be understood that where the circuit elements are correctly chosen resistors 32 and 34 can be eliminated (their value reduced to zero). Also, while the feedback is taken from terminal 11, resistor 32 can be returned to the base of transistor 20 and resistor 34 returned to the base of transistor 19. This connection will provide the desired feedback and will avoid loading the output terminal.

FIG. 3 shows the invention applied to an op amp. Transistors 37 and 38 are operated differentially and comprise input stage 12'. The output stage includes a differential to single-ended converter 10A and an output amplifier 10B which drives a load (not shown) connected to output terminal 11. The base of input transistor 37 is driven from noninverting (+) input terminal 13A and the base of input transistor 38 is driven from inverting (−) terminal 13B. When terminal 13B is connected to output terminal 11, as shown by dashed line 39, the circuit becomes a unity gain voltage follower in which the output voltage closely tracks the input voltage at terminal 13A. It is to be understood that while FIG. 3 shows a unity gain configuration, a voltage divider could be incorporated into the feedback connection 39 whereby a voltage gain will be present.

Resistors 40 and 41 are connected respectively in series with the emitters of transistors 37 and 38. This arrangement increases the linearity of input stage 12' and enhances the slew rate of the amplifier for a given unity gain bandwidth as is well known in the op amp art. Resistors 40 and 41 return the emitters of transistors 37 and 38 in common to the collector of transistor 42 which acts as a high impedance current sink and which causes transistors 37 and 38 to function as a differential pair.

Transistor 42 is shown as a dual emitter (43 and 44) device, but it can be composed of a pair of parallel connected transistors as illustrated in FIG. 3A. Here transistors 42A and 42B have their collectors and bases connected together. Two separate emitters, 43A and 43B, are available for external connection. Emitter 44 is returned to ground to conduct a replica of $I_1$ through transistor 42. This is the main current that flows in the input stage. $I_2$, which flows in emitter 43, is returned to ground through resistor 45. The value of resistor 45 is selected so that $I_2$ is a small fraction of $I_1$. Thus, $I_1$ substantially determines the quiescent current in input stage 12'. Transistor 42 is driven in a current mirror configuration from diode 46 which passes $I_1$ from current source 47. If the emitters in transistsor 42 are of the same area as diode 46 the current in emitter 44 will equal the current in source 47. However, if desired, the current mirror can be designed to provide a current gain or loss.

Feedback capacitor 48 is connected between output terminal 11 and emitter 43 of transistor 42. When the output potential at terminal 11 falls below its quiescent value $I_3$ will flow out of emitter 43. This will cause $I_3+I_1+I_2$ to flow in transistor 42. As a result, the gain and hence the slew rate of the circuit will be enhanced. When the output potential at terminal 11 rises $I_3$ will attempt to flow in the direction opposite to that shown. This will have the effect of reducing $I_2$ which can only fall to zero (it cannot reverse because it must flow in emitter 43). Since $I_2$ is much smaller than $I_1$ reducing it to zero will not appreciably alter the current in input stage 12'. The overall result is that the feedback through capacitor 38 will only enhance the slew rate for negative signal input excursions.

Since op amp voltage followers of the kind shown in FIG. 1, and detailed in FIG. 3, include a stray capacitance shown in dashed outline at 49, the circuit will ordinarily have a different slew rate for different input signal polarities. In the typical circuit with NPN input transistors the negative input signal slew rate is lower than the positive input signal slew rate. This is a well-known characteristic of op amp voltage followers. For example, when the well-known LM118 is employed as a voltage follower buffer its rated positive slew rate is 117 volts/microsecond and its rated negative slew rate is 80 volts/microsecond. By using the circuit of FIG. 3 the positive and negative signal slew rates can be made more nearly equal.

FIG. 4 illustrates a modification of FIG. 3 that produces improved results. The current mirror operation of transistor 42 is controlled by adding a pair of resistors. Resistor 49 is coupled in series with diode 46 so that $I_1$ flows in it. Resistor 50 is coupled in series with emitter 44. Resistor 51 replaces resistor 45 of FIG. 1 and is returned to diode 46' rather than to ground. This configuration provides a boot-strap circuit action. When $I_3$ flows out of emitter 43 (for negative output terminal 11 excursions) the current flow in resistor 49 is reduced and a lowered potential is applied to the base of transistor 42. This improves the action of the current mirror portion of the circuit.

Transistor 52 provides a clamp action for emitter 43 for positive output terminal excursions. Without transistor 52, the positive output terminal 11 excursions can be coupled to emitter 43 and, under extreme conditions, can force emitter 43 up to its zener breakdown level. With transistor 52 connected as shown, when the potential at emitter 43 exceeds one $V_{BE}$ above the potential at emitter 44, transistor 52 will turn on thereby clamping emitter 43 and preventing its rise to zener level.

If it is desired to enhance slew rate for both input signal polarities, the circuit of FIG. 5 can be used in the current mirror circuit of FIG. 3. This circuit incorporates two additional resistors 49' and 50', and a diode 53 in place of resistor 51 of FIG. 4. $I_1$ from source 47' flows in diode 46' and resistor 49'. If emitter 44' matches diode 46' and if resistors 49' and 50' are matched, $I_1$ will also flow in transistor 42' via emitter 44'. This is the quiescent current. When the output voltage at terminal 11 falls $I_3$ will flow out of emitter 43' and add to $I_1$ to increase the current in input stage 12' thereby enhancing slew rate. When the output voltage rises $I_3$ will flow into diode 53 thereby increasing the voltage drop across resistor 49'. Accordingly, the current flowing in resistor 49' will rise so that $I_3$ is effectively added to $I_1$. It is noted that such an addition of $I_1$ and $I_3$ will not occur on the positive output excursion until the voltage applied to diode 52 rises above a threshold level. This threshold level is fairly low (about $V_{BE}/2$) and will often not be significant.

The circuit of FIG. 6 avoids the above-described threshold effect. It includes the additional pair of resistors, 49" and 50" corresponding to those in FIG. 4. Diode 46' of FIG. 5 is replaced with emitter 46" of a dual diode. The other emitter 53" replaces diode 53 of FIG. 5. Level shifting diodes 54 and 55 are coupled to the dual diode and resistor 50" as shown. Resistors 56 and 57, respectively, couple dual diode emitter 53" and emitter 43" of transistor 42" to capacitor 48". Under quiescent conditions $I_1$ from source 47" flows in diode 54, the left-hand element of dual diode 53, and resistor 50. Due to current mirror action the same current will flow in emitter 44" of transistor 42". $I_2$, which will also flow in emitter 43", will flow in the right hand element of dual diode 53 and resistor 50. Thus, $I_1 + 2I_2$ will flow in the collector of transistor 42". Because of the presence of resistors 56 and 57, $I_2$ will be less than $I_1$ and preferably less than about $\frac{1}{2}$ of $I_1$.

When the output at terminal 11 rises, $I_3$ will flow into resistor 56 thereby adding to the value of $I_2$ flowing in resistor 49". This reflects through the current mirror as a rise in the collector current of transistor 42". When the output at terminal 11 falls, $I_3$ will flow the other way and will thereby flow out of emitter 43" and through resistor 57 so as to increase the collector current in transistor 42". Thus, the slew rate of the circuit will increase for both polarities of signal and there is no threshold effect.

EXAMPLE

The circuit of FIG. 3, using the FIG. 4 embodiment, was constructed in the form of a monolithic silicon junction-isolated IC. The following component values were employed:

| ELEMENT | VALUE | UNITS |
| --- | --- | --- |
| Resistors 40 and 41 | 600 | ohms |
| Current Source 47 | 0.6 | microamperes |
| Capacitor 48 | 3 | picofarads |
| Resistor 49 | 440 | ohms |
| Resistor 50 | 200 | ohms |
| Resistor 51 | 5K | ohms |

Transistors 37 and 38 were of conventional vertical high Beta NPN construction. Transistor 42 was of conventional vertical dual emitter construction. Transistor 52 was a conventional vertical PNP. Emitter 44 was sized to match the current density of diode 46 and emitter 43 was made one-half the area of emitter 44. The differential to single-end converter 10A and amplifier 10B were of conventional construction.

The resultant circuit had a positive slew rate of 260 volts/microsecond and a negative slew rate of 225 volts/microsecond. With capacitor 48 disconnected, the positive slew was 270 and the negative slew was 145.

The invention has been described and a working example detailed. When a person skilled in the art reads the foregoing description, alternatives and equivalents, within the spirit and intent of the invention, will be apparent. Accordingly, it is intended that the scope of the invention be limited only by the following claims.

I claim:

1. An integrated circuit amplifier having an input for receiving an input signal, and a single-ended output for reproducing said signal, said circuit comprising:
    an operational amplifier having inverting and noninverting inputs obtained by employing an input stage composed of a differentially connected pair of input transistors commonly operated by a current source which includes means for summing an additional current from a separate source; and
    a capacitor coupled between said single-ended output and said current source whereby a positive feedback current proportional to the time rate of change in potential at said output is coupled to said current source to provide said additional current.

2. The circuit of claim 1 wherein said current source comprises a dual emitter transistor having its collector coupled to the emitters of said pair of input transistors, and its base coupled to a diode to create a current mirror in which the current flowing in said diode is mirrored in said collector of said dual emitter transistor, means for returning one emitter to one terminal of said diode and to a reference potential level, a resistor coupled between a second emitter and said reference potential level, and means for coupling said capacitor to said one emitter.

3. The circuit of claim 2 further comprising a clamping transistor having an emitter coupled to said one emitter, a base coupled to said second emitter, and a collector coupled to a reference potential terminal.

4. The circuit of claim 1 wherein said operational amplifier inverting input is coupled to said single-ended output so that said amplifier, when driven at its noninverting input, acts as a buffer, said current source comprising:
    a dual emitter transistor having its base coupled in a current-mirror configuration to a current supply and to a first diode and a first resistor coupled in series to conduct the current in said current supply;
    a second resistor coupled to conduct the current flowing in one emitter of said dual emitter transistor;
    a second diode coupled to conduct the current flowing in the other emitter of said dual emitter transistor and connected so that its current also flows in said first resistor; and
    means for coupling said feedback capacitor to said other emitter of said dual emitter transistor whereby said dual emitter transistor collector conducts a current equal to said current supply current plus the current flowing in said feedback capacitor due to a circuit driving signal.

5. The circuit of claim 4 further comprising a third diode coupled in series with said first diode, a fourth diode coupled in series with said one emitter of said dual emitter transistor, a third resistor coupled in series with said second diode and a fourth resistor coupled in series with said other emitter of said dual emitter transistor.

6. The circuit of claims 6 or 7 wherein said dual emitter transistor is composed of two individual transistors having their collectors connected together to function as a single collector, their bases connected together to function as a single base, and wherein their emitters are available separately as individual emitters.

* * * * *